United States Patent [19]
Amino et al.
[11] Patent Number: 4,851,618
[45] Date of Patent: Jul. 25, 1989

[54] KEYBOARD

[75] Inventors: Fumihiro Amino; Zenzou Tozuka; Sadao Tachibana; Kazuo Aoki, all of Tokyo, Japan

[73] Assignee: Oki Electric Industry Co., Ltd., Tokyo, Japan

[21] Appl. No.: 195,842

[22] Filed: May 19, 1988

[30] Foreign Application Priority Data

May 22, 1987 [JP] Japan ............................ 62-76016[U]

[51] Int. Cl.[4] ...................... H01H 9/00; H01H 13/70; H05K 7/10

[52] U.S. Cl. .................................. 200/5 A; 200/293; 235/145 R

[58] Field of Search ........... 200/5 A, 159 B, 293-296, 200/307; 235/145 R; 400/472, 479, 488, 694

[56] References Cited

U.S. PATENT DOCUMENTS

| | | | |
|---|---|---|---|
| 438,430 | 10/1890 | Clerk | 400/479 X |
| 2,931,108 | 4/1960 | Brown | 400/479 X |
| 4,467,150 | 8/1984 | Leitermann et al. | 400/479 X |
| 4,528,428 | 7/1985 | Gotoh et al. | 400/488 X |
| 4,560,844 | 12/1985 | Takamura et al. | 400/488 X |
| 4,773,780 | 9/1988 | Hochgesang | 235/145 R X |

FOREIGN PATENT DOCUMENTS 62-94520 6/1987 Japan .

OTHER PUBLICATIONS

IBM Technical Disclosure Bulletin, vol. 20, No. 7, R. H. Harris, Dec. 1977, "Curved Keyboard", pp. 2784–2785.

*Primary Examiner*—J. R. Scott
*Attorney, Agent, or Firm*—Wenderoth, Lind & Ponack

[57] ABSTRACT

A keyboard comprises a base plate carrying contact circuits and provided with a plurality of holes, and a key holding frame integrally provided with key housings for receiving keys, vertically flexible posts for determining the lateral position of the base plate relative to the key holding frame, horizontally flexible posts for determining the lateral position of the base plate relative to the key holding frame in cooperation with the vertically flexible posts, fixed posts for determining the longitudinal position of the base plate relative to the key holding frame, and hooks for determining the vertical position of the base plate relative to the key holding fame and to hold the base plate firmly on the key holding frame. In combining the base plate and the key holding frame together, the base plate is moved in a lateral direction relative to the key holding frame so that the respective edges of the holes engage the corresponding hooks, and the vertically flexible posts are allowed to jump into the corresponding holes, after inserting the fixed posts, the horizontally flexible posts and the hooks in the corresponding holes. Thus, the base plate and the key holding frame can be joined together simply by placing the base plate on the key holding frame and sliding the base plate in a lateral direction relative to the key holding frame, without forcibly straining the component parts.

2 Claims, 7 Drawing Sheets

KEYBOARD

BACKGROUND OF THE INVENTION

1. Field of the Invention:

The present invention relates to a keyboard for use as an input device for various information processing equipments such as personal computers and word processors.

2. Description of the Related Art:

A conventional keyboard is disclosed in Japanese Utility Model Application No. 60-185509 applied for on Dec. 3, 1985 for utility model registration by the present applicant. That Japanese application was published on June 16, 1987 as a kokai 62-94520.--; This keyboard will be described with reference to FIGS. 1 through 5.

Referring to FIG. 1 showing a keyboard in a schematic side elevation, the keyboard comprises keys 1, a key holding frame 2, a base plate 3 provided with contact circuits, a bottom plate 4 formed of a metal plate having large rigidity, and a casing 5 indicated by alternate long and two short dashes lines. Referring to FIGS. 2 and 3, the key holding frame 2 is an integral member having a plurality of housings 2*a* respectively for receiving the keys 1 therein, a plurality of hooks 2*b*, and two posts 2*c*. The base plate 3 has a plurality of rectangular holes 3*a* respectively for receiving the hooks 2*b* of the key holding frame 2 therethrough, and two circular holes 3*b* respectively for receiving the posts 2*c* to position the key holding frame 2 relative to the base plate 3. The bottom plate 4 has a plurality of rectangular holes 4*a* with which the hooks 2*b* of the key holding frame 2 engage, respectively, to define the vertical position of the key holding frame 2 relative to the bottom plate 4 and two circular holes 4*b* for receiving the post 2*c* of the key holding frame 2 to position the key holding frame 2 relative to the bottom plate 4.

In assembling the keyboard, the bottom plate 4, the base plate 3 and the key holding frame 2 are placed one over another in that order with the two posts 2*c* of the key holding frame 2 positioned opposite to the two circular holes 3*b* of the base plate 3 and the two circular holes 4*b* of the bottom plate 4, respectively. Then, as shown in FIG. 4, the key holding frame 2 is pressed in the direction of an arrow B so that the inclined surface 2*d* of the head 2*f* of each hook 2*b* of the key holding frame 2 slides along one side 4*c* of the corresponding rectangular hole 4*a* of the bottom plate 4, and thereby the leg 2*e* of each hook 2*b* is forced to flex and the head 2*f* of the hook 2*b* projects downward from the rectangular hole 4*a* of the bottom plate 4 and engages the edge of the corresponding rectangular hole 4*a*. In this state, the respective legs 2*e* of the hooks 2*b* are flexed resiliently so as to strain each other, so that the heads 2*f* of the hooks 2*b* firmly engage the respective side edges of the corresponding rectangular holes 4a to join the key holding frame 2, the base plate 3 and the bottom plate 4 firmly together. The relative position between the key holding frame 2, the base plate 3 and the bottom plate 4 is determined by the engagement of the posts 2*c* and the circular holes 3*b* and 4*b*. The base plate 3 and the bottom plate 4 may be formed integrally in a single member.

This keyboard, however, requires a large force to press the key holding frame 2 in the direction of the arrow B in assembling the key holding frame 2, the base plate 3 and the bottom plate 4 making the assembling work difficult and, in some cases, the key holding frame 2, the base plate 3 and the bottom plate 4 cannot firmly be joined together owing to the plastic deformation of the tips 2*g* of the hooks 2*b* as shown in FIG. 5. Furthermore, since the longitudinal and lateral movement of the base plate 3 relative to the key holding plate 2 is limited by the engagement of the posts 2*c* and the circular holes 3*c*, the central portion of the key holding frame 2 is caused to warp particularly with respect to the longitudinal direction by the difference in coefficients of thermal expansion between the key holding frame 2 and the base plate 3, which makes the keys give an unpleasant touch or feel to the fingers when in use.

SUMMARY OF THE INVENTION

Accordingly, it is an object of the present invention to provide a keyboard having a key holding frame and a base plate which are joined firmly together so that the key holding frame will not be caused to warp by the difference in coefficient of thermal expansion between the key holding frame and the base plate, and capable of being easily and firmly assembled without requiring large force for assembling the components and without entailing the plastic deformation of hooks for connecting the components.

To achieve the object of the invention, the present invention provides a keyboard comprising a base plate carrying contact circuits and provided with a plurality of first, second, third and fourth holes; and a key holding frame integrally provided with a plurality of key housings, a plurality vertically flexible posts engaging the second holes to determine the lateral position of the base plate relative to the key holding frame, horizontally flexible posts engaging the third holes of the base plate to determine the lateral position of the base plate relative to the key holding frame, fixed posts engaging the fourth holes of the base plate to determine the longitudinal position of the base plate relative to the key holding frame, and a plurality of hooks respectively engaging the edges of the first and fourth holes of the base plate to determine the vertical position of the base plate relative to the key holding frame and to hold the base plate firmly on the key holding frame; characterized in that the fixed posts are provided substantially in the middle portions near the opposite longitudinal sides of the key holding frame, that the horizontally flexible posts are disposed respectively opposite the vertically flexible posts, that the fixed posts have a play relative to the corresponding fourth holes with respect to the lateral direction, that the fixed posts fit the corresponding fourth holes closely with respect to the longitudinal direction, and that, in combining the base plate and the key holding frame together, the base plate is moved in a lateral direction relative to the key holding frame so that the respective edges of the fourth holes engage the corresponding hooks and the vertically flexible posts are allowed to jump into the corresponding second holes, after inserting the fixed posts in the corresponding fourth holes of the base plate, the horizontally flexible posts in the corresponding third holes, and the hooks in the corresponding first and fourth holes. Thus, the base plate is positioned correctly relative to the key holding frame with respect to the lateral and longitudinal directions and is held in place by the vertically flexible posts, the laterally flexible posts and the hooks.

The above and other objects, features and advantages of the present invention will become fully apparent from the following description taken in conjunction with the accompanying drawings.

DESCRIPTION OF THE PREFERRED EMBODIMENT

Figure 1:
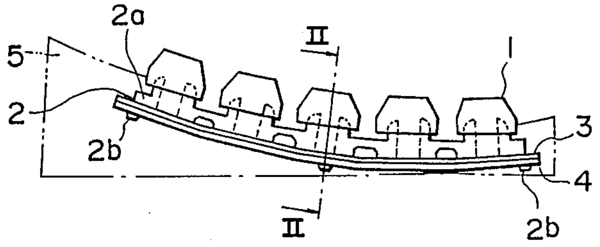
FIG. 1 PRIOR ART
FIG. 1 is a schematic side elevation of a conventional keyboard.
Figure 2:
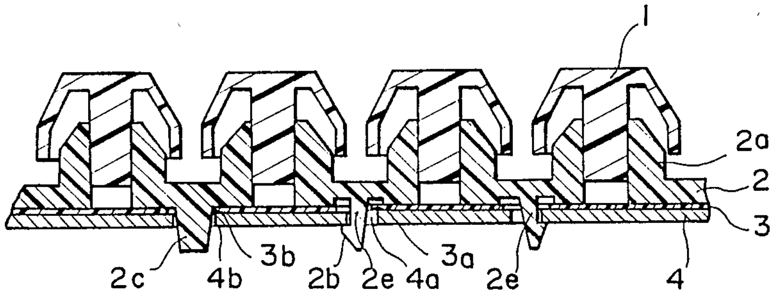
FIG. 2 PRIOR ART
FIG. 2 is an enlarged fragmentary sectional view taken on line II—II in FIG. 1.
Figure 3:
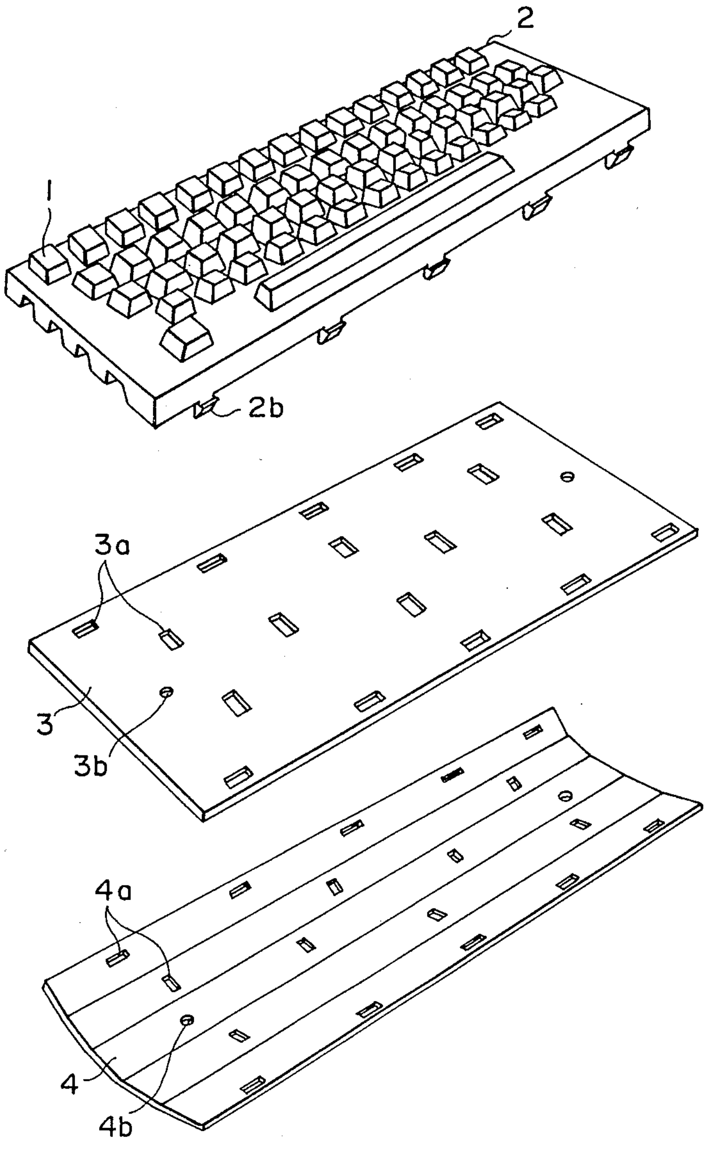
FIG. 3 PRIOR ART
FIG. 3 is an exploded perspective view of the keyboard of FIG. 1.
Figure 4:
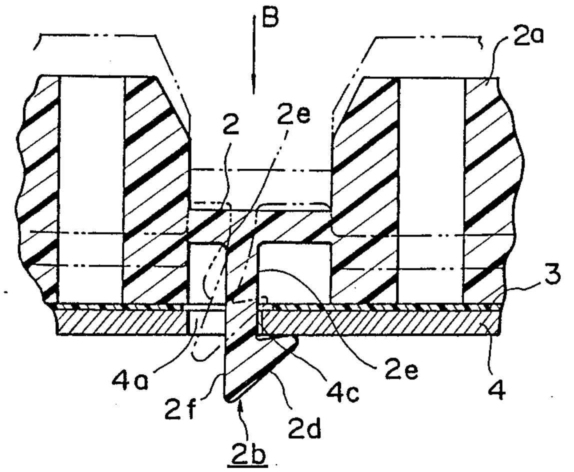
FIG. 4 PRIOR ART
FIG. 4 is an enlarged fragmentary sectional view of the keyboard of FIG. 1.
Figure 5:
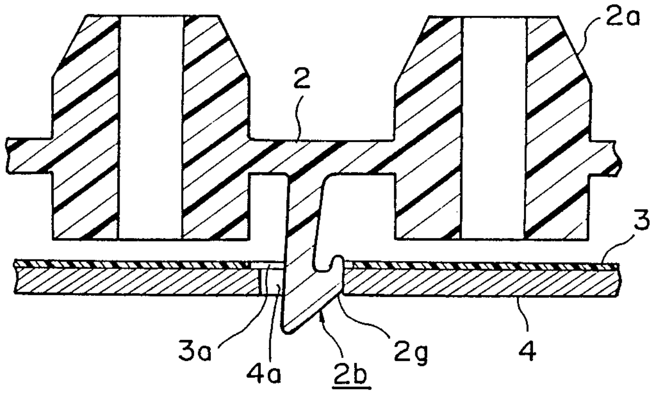
FIG. 5 PRIOR ART
FIG. 5 is an enlarged fragmentary sectional view of the keyboard of FIG. 1, showing the plastic deformation of the tip of a hook of the keyboard of FIG. 1.

A keyboard, in a preferred embodiment, according to the present invention will be described hereinafter with reference to FIGS. 6 through 12, in which like reference numerals designate like or corresponding parts throughout the drawings. In the following description, longitudinal direction (directions parallel to the longer sides of the keyboard), lateral directions (directions parallel to the shorter sides of the keyboard) and vertical directions (directions perpendicular to the major surface of the keyboard) are referred to as directions x–x' directions y–y' and directions z–z', respectively.

Figure 6:
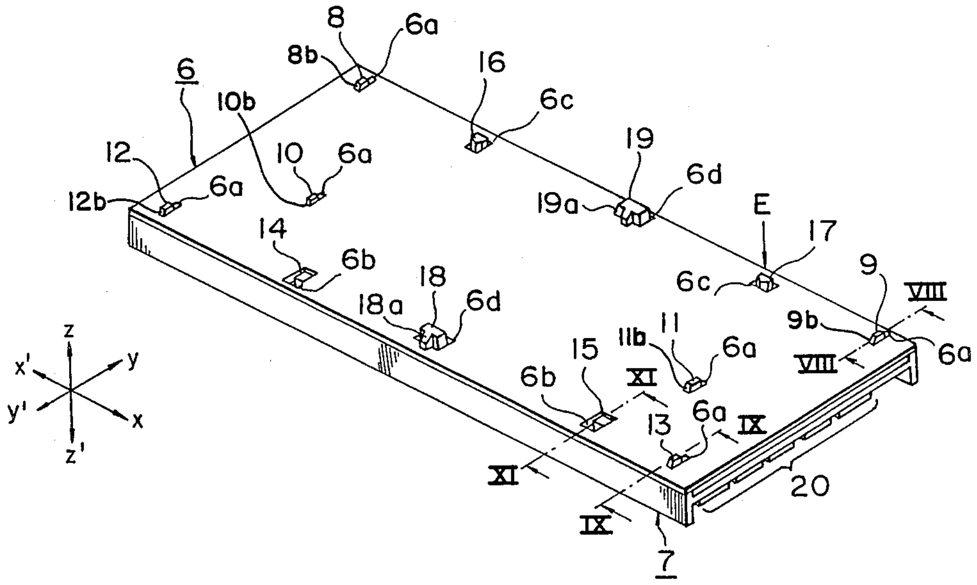
FIG. 6 is a perspective bottom view of a keyboard, in a preferred embodiment, according to the present invention.

Referring to FIG. 6 showing the assembly of a base plate 6 and a key holding frame 7, the base plate carrying contact circuits is fixed to the backside of the key holding frame 7. The position of the base plate 6 relative to the key holding frame 7 with respect to the directions x–x' is determined by the engagement of posts 18 and 19 of the key holding frame 7 respectively with rectangular holes 6*d* of the base plate 6. The position of the base plate 6 relative to the key holding frame 7 with respect to the directions y–y' is determined by the engagement of vertically flexible posts 14 and 15 of the key holding frame 7 respectively with rectangular holes 6*b* of the base plate 6 and the engagement of horizontally flexible posts 16 and 17 of the key holding frame 7, provided respectively opposite the vertically flexible posts 14 and 15, respectively with rectangular holes 6*c* of the base plate 6. The respective inner edges of the rectangular holes 6*b* and 6*c* are in contact with the respective inner surfaces of the corresponding posts 14, 15, 16 and 17, respectively so that the base plate 6 is held in place on the key holding frame 7. The position of the base plate 6 relative to the key holding frame 7 with respect to the directions z–z' is determined by hooks 8, 9, 10, 11, 12 and 13, and 18*a* and 19*a* of the key holding frame 7 projecting respectively through holes 6*a* and the rectangular holes 6*d*, and engaging the base plate 6, which is similar to that of the conventional keyboard.

Figure 7:
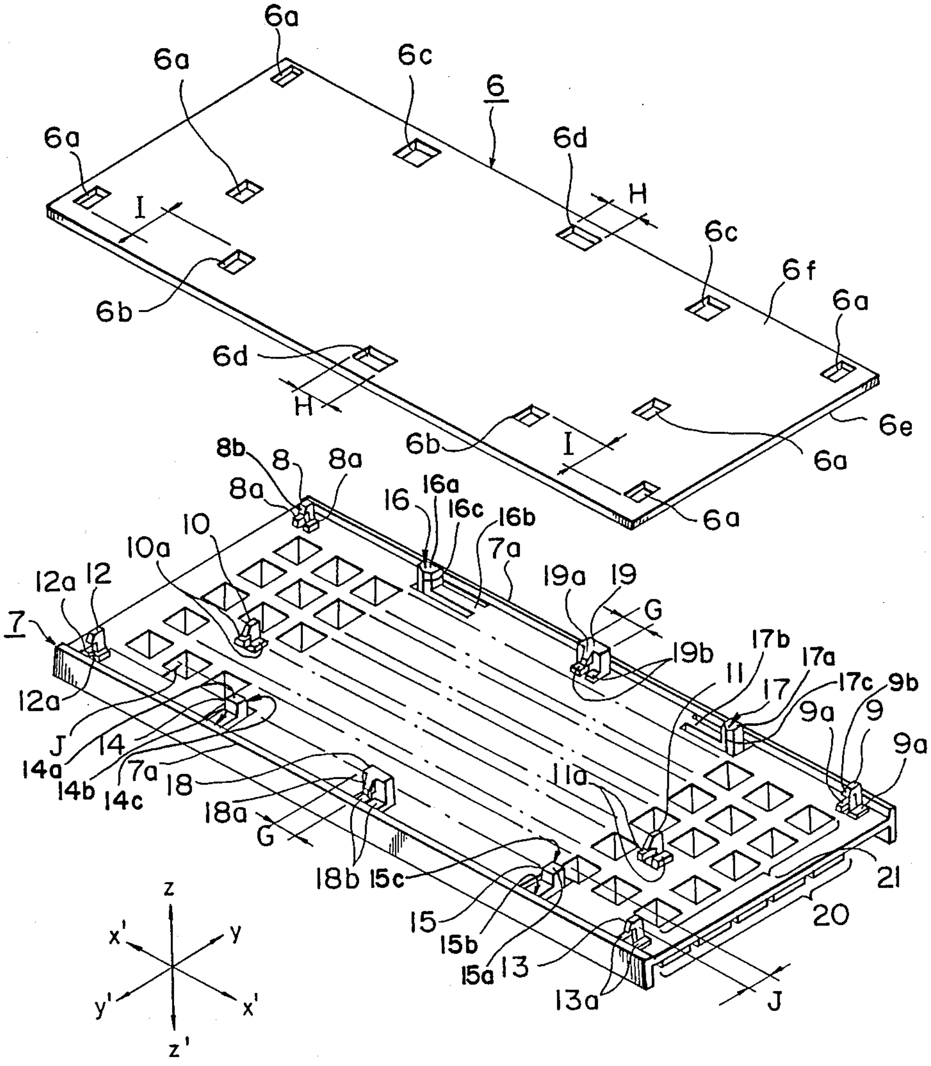
FIG. 7 is an exploded perspective view of the keyboard of FIG. 6.
Figure 8:
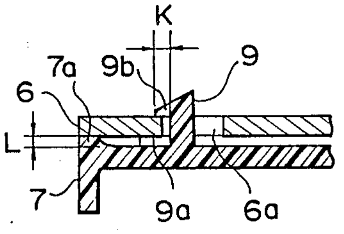
FIG. 8 is an enlarged fragmentary sectional view taken on line VIII—VIII in FIG. 6.
Figure 9:
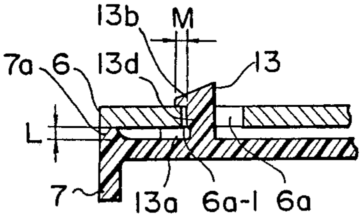
FIG. 9 is an enlarged fragmentary sectional view taken on line IX—IX in FIG. 6.

Referring to FIG. 7, the hooks 8, 9, 10, 11, 12, 13, 18*a* and 19*a*, the posts 14, 15, 16, 17, 18 and 19, and key housings 20 are formed integrally in the backside of the key holding frame 7. The key housings 20 each have a square hole 21 for receiving a key 1 therein. The hooks 8, 9, 10 and 11 are the same in shape and size, are formed substantially in an L-shape as shown in FIG. 8, and have spacing seats 8*a*, 9*a*, 10*a* and 11*a* having a height corresponding to the height L of the edges 7*a* of the key holding frame7, and hook-shaped tips 8*b*, 9*b*, 10*b* and 11*b* projecting from the bodies by a length K, respectively. The hooks 12 and 13 are the same in shape and size, are formed substantially in an L-shape as shown in FIG. 9, have spacing seats 12*a* and 13*a* having a height corresponding to the height L of the edges 7*a* of the key holding frame 7, hook-shaped tips 12*b* and 13*b* projecting from the bodies (hooks 8 and 9) by a length M, and contact surfaces 12*d* and 13*d*, respectively. Since the hooks 12 and 13 have the contact surfaces (of which only exemplary contact surface 13*d* is numbered)--;, the length M is smaller than the length L by about 0.4 mm.

Figure 11:
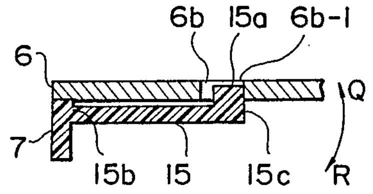
FIG. 11 is an enlarged fragmentary sectional view taken on line XI—XI in FIG. 6.
Figure 12:
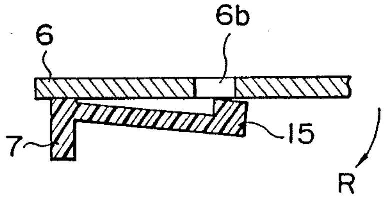
FIG. 12 is an enlarge fragmentary sectional view similar to FIG. 11, of assistance in explaining a step of assembling the keyboard of FIG. 6.

The vertically flexible posts 14 and 15 are the same in shape and size, are formed substantially in an L-shape as shown in FIG. 11, and are able to be flexed so that the heads 14*a* and 15*a* move in the directions of arrows Q and R about the roots 14*b* and 15*b* thereof as shown in FIG. 11. In FIG. 12, the vertically flexible post 15 (as would be with post )14 --; is flexed in the direction of the arrow R for engagement with the hole 6*b*.

Figure 10:
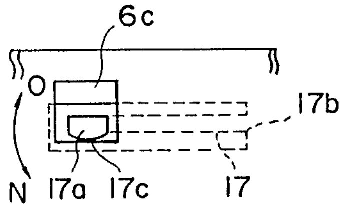
FIG. 10 is a view taken along the direction of an arrow E in FIG. 6.

The horizontally flexible posts 16 and 17 are the same in shape and size, are formed substantially in an L-shape, are provided respectively substantially opposite the vertically flexible posts 14 and 15, and are able to be flexed about the respective roots 16*b* and 17*b* thereof so that the heads 16*a* and 17*a* are moved in the directions of arrows N and O as shown in FIG. 10. The respective surfaces of the heads 16*a* and 17*a* respectively facing the vertically flexible posts 14 and 15 are formed as convex surfaces 16*c* and 17*c*, respectively, as shown in FIG. 10.

The posts 18 and 19 are fixed posts substantially at the middle parts of the opposite sides of the key holding frame 7 extending along the directions x–x', respectively, are provided respectively with hook-shaped tips 18*a* and 19*a* having the same shape and size as that of the hook 9 and projecting in the direction y', and are provided respectively with spacing seats 18*b* and 19*b*.

The contact circuits or printed circuit having switch circuit pattern for a plurality of keys, not shown are formed. respectively on the opposite major surfaces 6*e* and 6*f*, namely, the surface facing the key holding frame 7 and the surface opposite the former. The contact circuits are known to a person having ordinary skill in the art and would include known printed circuits for switches as well as known contact switches (as shown in, for example, FIG. 6 of Japanese unexamined published application 62-94520 discussed in column 1 above).--; The rectangular holes 6*a* for receiving the hooks 8, 9, 10, 11, 12 and 13, the rectangular holes 6*b* for receiving the vertically flexible posts 14 and 15, the rectangular holes 6*c* for receiving the horizontally flexible posts 16 and 17, and the rectangular holes 6*d* for receiving the fixed posts 18 and 19 are formed in the base plate 6. The size G of the posts 18 and 19 of the key holding frame 7 with respect to the directions x–x' is smaller than the size H of the rectangular holes 6d of the base plate 6 with respect to the directions x–x' by a value in the range of 0.1 to 0.2 mm. A play on the order of 1 mm with respect to the directions x–x' is provided between the hooks 8, 9, 10, 11, 12 and 13 and the corresponding rectangular holes 6*a*, between the vertically flexible posts 14 and 15 and the corresponding rectangular holes 6*b*, and between the horizontally flexible posts 16 and 17 and the corresponding rectangular holes 6*c*.

The distance J (FIG. 7) with respect to the directions y–y' between the contact surface 13*d* of the hook 13 (and of course an analogous unnumbered contact surface on hook 12)--; of the key holding frame 7 and the front surface 15*c* and 14*c* (the surface facing the direction y) of the head 15*a* and 14*a* of the vertically flexible post 15 and 14 is smaller than the distance I (FIG.7) with respect to the directions y–y' between the rear edge (the edge facing the direction y') of the rectangular hole 6*a* and the front edge (the edge facing the direction y) of the rectangular hole 6*b* of the base plate 6 by a value in the range of 0.1 to 0.2 mm.

In assembling the base plate 6 and the key holding frame 7, the base plate 6 is placed over the key holding frame 7 with the rectangular holes 6*d* thereof in alignment with the corresponding posts 18 and 19, the rectangular holes 6*a* thereof in alignment with the corresponding hooks 8, 9, 10, 11, 12 and 13, and the rectangular holes 6*c* thereof in alignment with the corresponding horizontally flexible posts 16 and 17. Then, the base plate 6 is placed on the key holding frame 7 so that the posts 16 to 19 and the hooks 8 to 13 of the key holding frame 7 are received in the corresponding rectangular holes. The position with respect to the directions x–x' of the base plate 6 relative to the key holding frame 7 is determined by the posts 18 and 19. Thus, the base plate 6 is seated on the respective spacing seats 8*a* to 13*a*, 18*b* and 19*b* of the hooks 8 to 13 and the posts 18 and 19 and the edge 7*a* of the key holding frame 7. In this state, the vertically flexible posts 14 and 15 are flexed in the direction of the arrow R as shown in FIG. 12 by the base plate 6. In this state, the base plate 6 is moved in the direction y relative to the key holding frame 7 as far as the contact surfaces 13*d* of the hook 13 and (12), respectively is brought into contact with one edge 6*a*-1 of the respective rectangular hole 6*a* (6*a*) as shown in FIG. 9 (only the hook 13 is shown), and thereby the head 15*a* of the vertically flexible post 15 is allowed to jump into the rectangular hole 6*b* as shown in FIG. 11 (only the post 15 although the action of post 14 is the same,--, is shown), and the horizontally flexible posts 16 and 17 are bent in the direction of the arrow O as shown in FIG. 10 (only the post 17 is shown). When the base plate 6 is released after the hooks 12 and 13 are brought respectively into contact with the edges 6*a*-1 of the rectangular holes 6*a*, the horizontally flexible posts 16 and 17 urge themselves to swing in the direction of the arrow N (FIG. 10) and, consequently, the base plate 6 is pressed in the direction y' by the horizontally flexible posts 16 and 17 which are in contact with the base plate 6 at the convex surfaces 16*c* and 17*c*, and thereby the respective edges 6*b*-1 of the rectangular holes 6*b* are brought into contact with the respective front surfaces 14*c* and 15*c* of the vertically flexible posts 14 and 15, respectively as shown in FIG. 11 (only the vertically flexible post 15 is shown). Thus, the position of the base plate 6 with respect to the directions y–y' relative to the key holding frame 7 is determined. In this state, the base plate 6 is held between the hook-shaped tips and spacing seats of the hooks as shown in FIGS. 8 and 9, and thereby the position of the base plate with respect to the directions z–z' relative to the key holding frame 7.

In this embodiment, the posts for determining the relative position between the base plate 6 and the key holding frame 7 with respect to the directions x–x' are provided on the key holding frame 7, and the corresponding rectangular holes are formed in the base plate. However, it is also possible to provide the same posts on the base plate 6 and to form the same rectangular hole in the key holding frame 7.

Although the invention has been described in its preferred form with a certain degree of particularity, obviously many changes and variations are possible therein. It is therefore to be understood that the invention may be practiced otherwise than specifically described herein without departing from the scope and spirit thereof.

What is claimed is:

1. A keyboard comprising;

a base plate having a subsantially horizontal major surface and spaced opposed longitudinal sides;

means on said substantially horizontal major surface of said base plate for attaching a printed circuit having a switch circuit pattern for a plurality of keys;

a plurality of first holes, a plurality of second holes, a plurality of third holes, and a plurality of fourth holes in said major surface of said base plate;

a key holding frame having a substantially horizontal major surface, and said key holding frame being attached to said base plate;

a plurality of key housings in said substantially horizontal major surface of said key holding frame for receiving a respective plurality of keys;

a plurality of vertically flexible posts attached to said substantially horizontal major surface of said key holding frame and engaging ones of said plurality of second holes in said base plate for determining the lateral position of said base plate relative to said key holding frame;

a plurality of horizontally flexible posts attached to said substantially horizontal major surface of said key holding frame and engaging ones of said plurality of third holes in said base plate for determining the lateral position of said base plate relative to said key holding frame in cooperation with said plurality of vertically flexible posts, said plurality of horizontally flexible posts being spaced opposed from respective ones of said plurality of vertically flexible posts;

a plurality of fixed posts attached to said substantially horizontal major surface of said key holding frame and engaging ones of said plurality of fourth holes in said base plate for determining the longitudinal position of said base plate relative to said key holding frame, said plurality of fixed posts being located substantially in the middle and near said spaced opposed longitudinal sides of said key holding frame, said plurality of fixed posts having play relative to said plurality of fourth holes with respect to the lateral direction, and said plurality of fixed posts fitting said plurality of fourth holes closely with respect to the longitudinal direction;

a plurality of hooks engaging horizontal edges of ones of said first and fourth holes in said base plate for determining the vertical position of said base plate relative to said key holding plate and for holding said base plate firmly on said key holding frame; and wherein, when said base plate and said key holding frame are attached, said base plate is moved in a lateral direction relative to said key holding frame for engaging the respective horizontal edges of the said ones of said pluralities of first and fourth holes with said plurality of hooks, and said verticaly flexible posts are caused to jump into ones of said plurality of second holes after inserting said plurality of fixed posts in ones of said plurality of fourth holes, inserting said plurality of horizontally flexible posts in ones of said plurality of third holes, and inserting said plurality of hooks in ones of said pluralities of first and fourth holes.

2. A keyboard according to claim 1, wherein the distance between the surface of a head of ones of said plurality of vertically flexible posts facing an inner side of said key holding frame and a contact surface of ones of said plurality of hooks attached near the same longitudinal side of said key holding frame is slightly less than the distance between the horizontal edge of ones of said plurality of first holes for receiving ones of said plurality of hooks on the outer side of said key holding frame and an edge of ones of said plurality of second holes for receiving said plurality of vertically flexible posts on an inner side of said key holding frame.

* * * * *